United States Patent [19]

Shinozaki

[11] Patent Number: 5,802,596

[45] Date of Patent: Sep. 1, 1998

[54] HIGH SPEED SYNCHRONOUS DRAM HAVING A PIPELINE STRUCTURE

[75] Inventor: Naoharu Shinozaki, Kawasaki, Japan

[73] Assignee: Fujitsu Limited, Kanagawa, Japan

[21] Appl. No.: 570,549

[22] Filed: Dec. 11, 1995

[30] Foreign Application Priority Data

Aug. 17, 1995 [JP] Japan ................... 7-209655

[51] Int. Cl.$^6$ ................................... G06F 9/38
[52] U.S. Cl. ............... 711/169; 711/167; 395/881; 395/880
[58] Field of Search ............ 365/189.05; 395/840, 395/880, 872, 881; 711/169, 167, 105

[56] References Cited

U.S. PATENT DOCUMENTS 5,306,962  4/1994  Lamb ................................... 327/259
5,426,606  6/1995  Takai ................................. 365/189.05

FOREIGN PATENT DOCUMENTS

0618585A2  10/1994  European Pat. Off. .
2 246 004 A  1/1992  United Kingdom .

Primary Examiner—Tod R. Swann
Assistant Examiner—J. Peikari
Attorney, Agent, or Firm—Nikaido, Marmelstein, Murray & Oram LLP

[57] ABSTRACT

An SDRAM offering an increased operating speed and needing a limited area for layout is provided. In the synchronous DRAM, at least part of the signal processing to be executed continually is divided into a plurality of steps, the plurality of steps are executed concurrently in synchronization with an external clock applied externally, and thus the operating speed is increased. The synchronous DRAM comprises a plurality of pipes (i.e. plurality of pipeline stages) concurrently execute the plurality of steps, gates each of which is interposed between each pair of the plurality of pipes and controls passage of a signal between adjoining pipes, and gate control means each producing a pulsating control signal from an external clock and applying the control signal to a gate to control the gate in such a way that the gate will enter a transfer state immediately before an output from a pipe of a previous stage is finalized or enter a non-transfer state immediately after the output from the pipe of the previous stage is transferred to a pipe of the next stage.

9 Claims, 8 Drawing Sheets

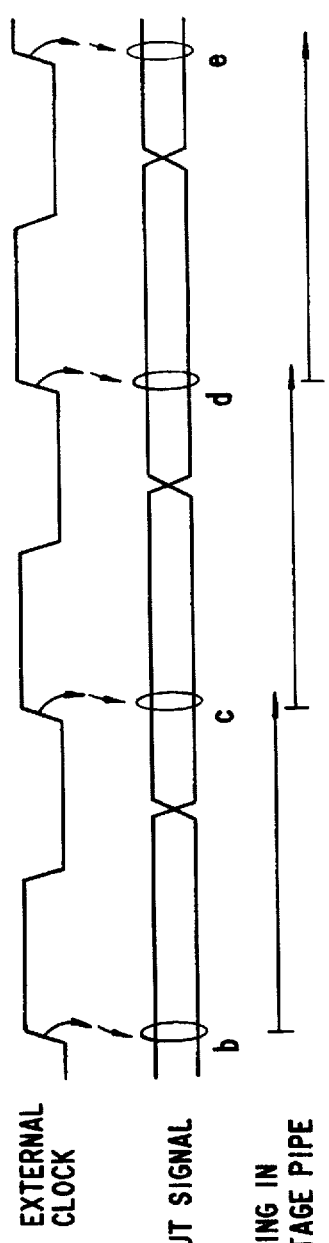
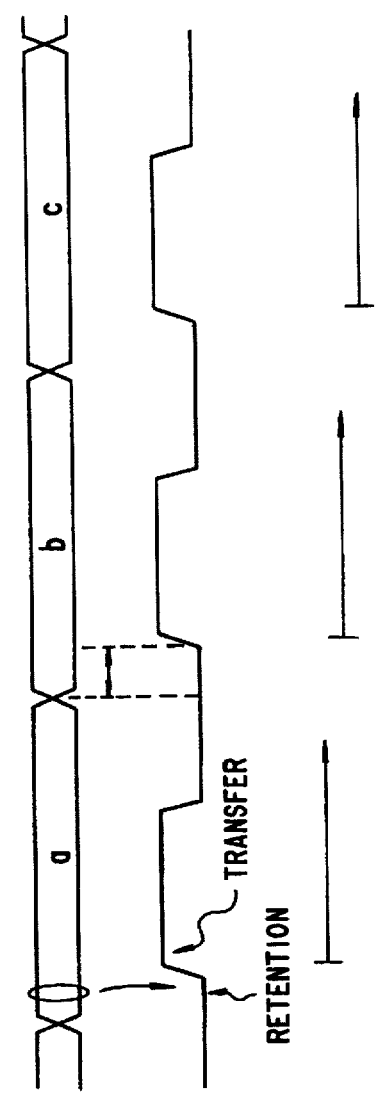
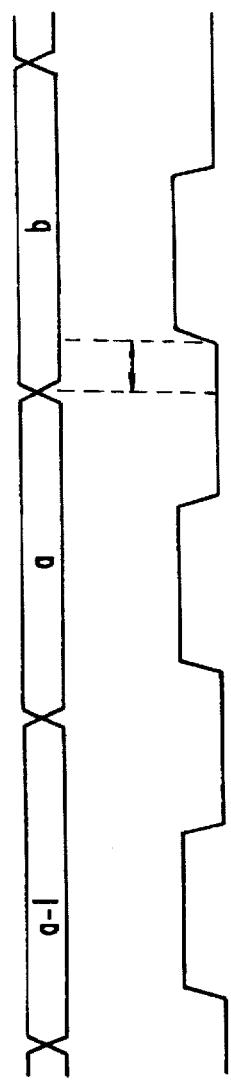
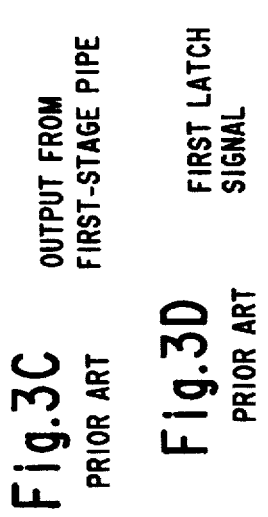
Fig.3A PRIOR ART — EXTERNAL CLOCK
Fig.3B PRIOR ART — INPUT SIGNAL
PROCESSING IN FIRST-STAGE PIPE
Fig.3C PRIOR ART — OUTPUT FROM FIRST-STAGE PIPE
Fig.3D PRIOR ART — FIRST LATCH SIGNAL
Fig.3E PRIOR ART — OUTPUT FROM SECOND-STAGE PIPE
Fig.3F PRIOR ART — SECOND LATCH SIGNAL

EXTERNAL CLOCK

PROCESSING IN
FIRST STAGE

OUTPUT FROM
FIRST STAGE

FIRST GATE

OUTPUT FROM
SECOND STAGE

SECOND GATE

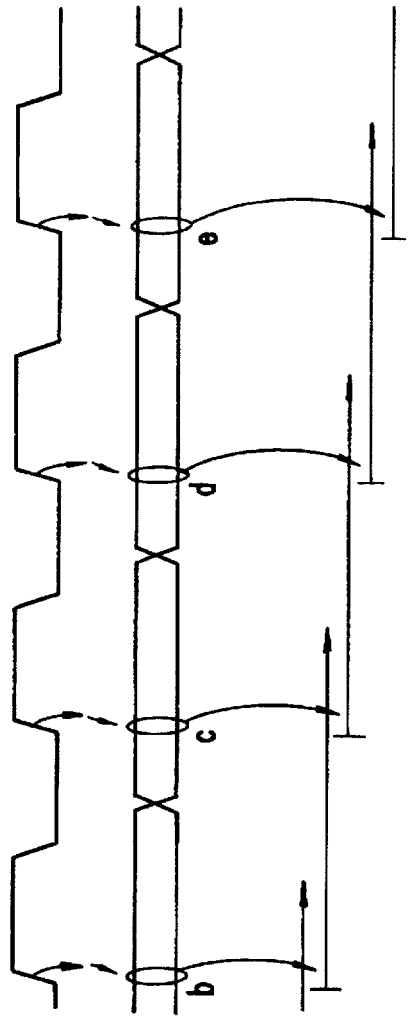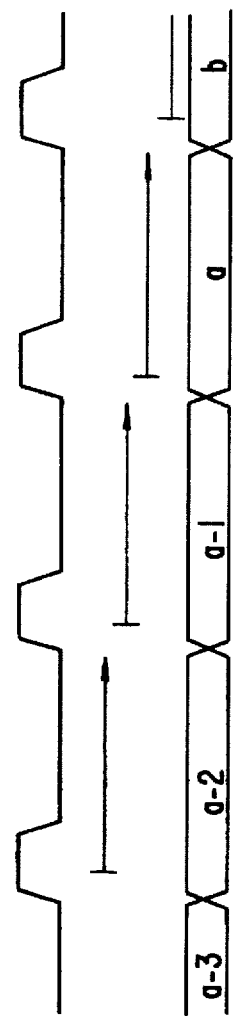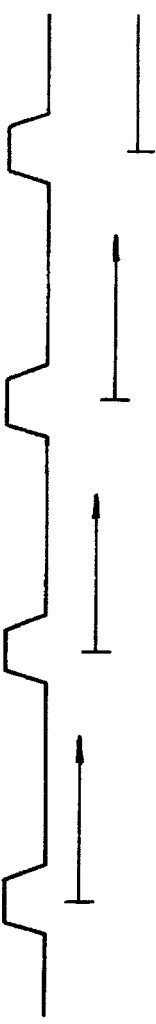
Fig.8A EXTERNAL CLOCK
Fig.8B INPUT SIGNAL DATA OR ADDRESS PROCESSING IN FIRST-STAGE PIPE
Fig.8C OUTPUT FROM FIRST-STAGE PIPE
Fig.8D FIRST GATE PROCESSING IN SECOND-STAGE PIPE
Fig.8E OUTPUT FROM SECOND-STAGE
Fig.8F SECOND GATE PROCESSING IN THIRD-STAGE PIPE

HIGH SPEED SYNCHRONOUS DRAM HAVING A PIPELINE STRUCTURE

BACKGROUND OF THE INVENTION

1. Field of the Invention

The present invention relates to a synchronous dynamic RAM (hereinafter SDRAM) in which a sequence circuit for continually executing signal processing such as writing or reading of data in or from a memory cell array is divided into a plurality of pipeline stages, the pipeline pipes stages, are hereinafter are operated concurrently in synchronization with an external clock applied externally, and thus the operating speed is upgraded. More particularly, this invention is concerned with an SDRAM having a pipe structure that permits a higher operating speed.

2. Description of the Related Art

In recent years, even in a dynamic RAM (DRAM), an increase in the operating speed has been required. Taking reading for instance, a DRAM carries out such operations as decoding an address signal necessary for accessing a memory cell, charging a bit line, driving a sense amplifier or the like within a memory cell array and then supplies an output of the sense amplifier through a data output circuit. The operating speed of the DRAM is determined by the total processing time required for continually executing processing. If some of operations including a kind of processing are executed concurrently, the longest processing time required for one of the operations to be executed concurrently is added to the times required for the other operations. The operating speed is thus determined. One method for upgrading the operating speed of the DRAM is to increase the ratio of operations that can be executed concurrently with all other operations. However, a signal produced by decoding is needed for accessing a word line or a bit line. This kind of operation cannot be executed concurrently with any other operation.

Another method for increasing the operating speed of a DRAM arranges that a circuit that is operated continually (hereinafter referred to as a sequence circuit) in a plurality of stages, and the plurality of stages are operated concurrently in synchronization with an external clock applied externally. Thus, the operating speed of a DRAM is substantially upgraded. The stages are referred to as pipes. This process shall therefore be called piping. Piping will be described briefly.

Gates are interposed between pipes in adjoining stages. The gates control passage of a signal between adjoining pipes so that an output from a pipe of a previous stage will be transferred according to appropriate timing. The gates are controlled by signals produced by delaying an external clock using the delay circuits.

In the circuitry of a gate employed in a known SDRAM, a signal to be fed to the first-stage pipe synchronously with an external clock is sampled continually. After the foregoing processing is completed at all stages, an output is supplied successively from the last stage pipe at intervals of the cycle of the external clock. The first output is supplied after an elapse of time calculated by adding up times required for passage through all the gates and processing times required in all the stage pipes. Thereafter, a result of processing is supplied successively from the last stage pipe at intervals of the cycle of the external clock. Thus, the processing speed increases practically.

In this way, piping contributes to an improvement in the operating speed of an SDRAM. Nevertheless, the operating speed of CPUs incorporated in computers in which SDRAMs are mainly employed have improved markedly. Accordingly, it has become necessary to further upgrade the operating speed of an SDRAM. Piping requires installation of gates. Otherwise, the gates are not needed as they are conventionally not installed. The circuitry of an SDRAM is therefore expanded by the sizes of the gates. Consequently, a larger area in a chip becomes necessary for laying out the circuit elements of an SDRAM. From this viewpoint, the area required for laying out gates is required to be as small as possible.

SUMMARY OF THE INVENTION

An object of the present invention is to realize an SDRAM meeting the foregoing requirements or to realize an SDRAM offering an upgraded operating speed and needing a limited area for layout.

In an SDRAM according to the present invention, at least part of the signal processing to be executed continually is divided into a plurality of steps, the plurality of steps are executed concurrently in synchronization with an external clock applied externally. The SDRAM comprises a plurality of pipes which concurrently execute the plurality of steps, gates each of which is interposed between each pair of the plurality of pipes in order to control passage of a signal between adjoining pipes, and gate control circuits each producing a control signal using an external clock and applying the control signal to the gate to control the gate in such a way that the gate will enter a transfer state immediately before an output from a pipe of a previous stage is finalized or will enter an on-passage stage immediately after the output from the pipe of the previous state is transferred to a pipe of the next stage.

As mentioned above, when an output from a pipe consists of a plurality of bits, a plurality of gates are needed.

BRIEF DESCRIPTION OF THE DRAWINGS

The present invention will be more clearly understood from the description as set forth below with reference to the accompanying drawings, wherein:

FIG. 3 shows piping performed in the known SDRAM;

FIG. 8 shows the operations performed in the pipe structure in the embodiment.

DESCRIPTION OF THE PREFERRED EMBODIMENTS

Before proceeding to a detailed description of the preferred embodiments of the present invention, a prior art SDRAM will be described to allow a clearer understanding of the difference between the present invention and the prior art.

Figure 1:
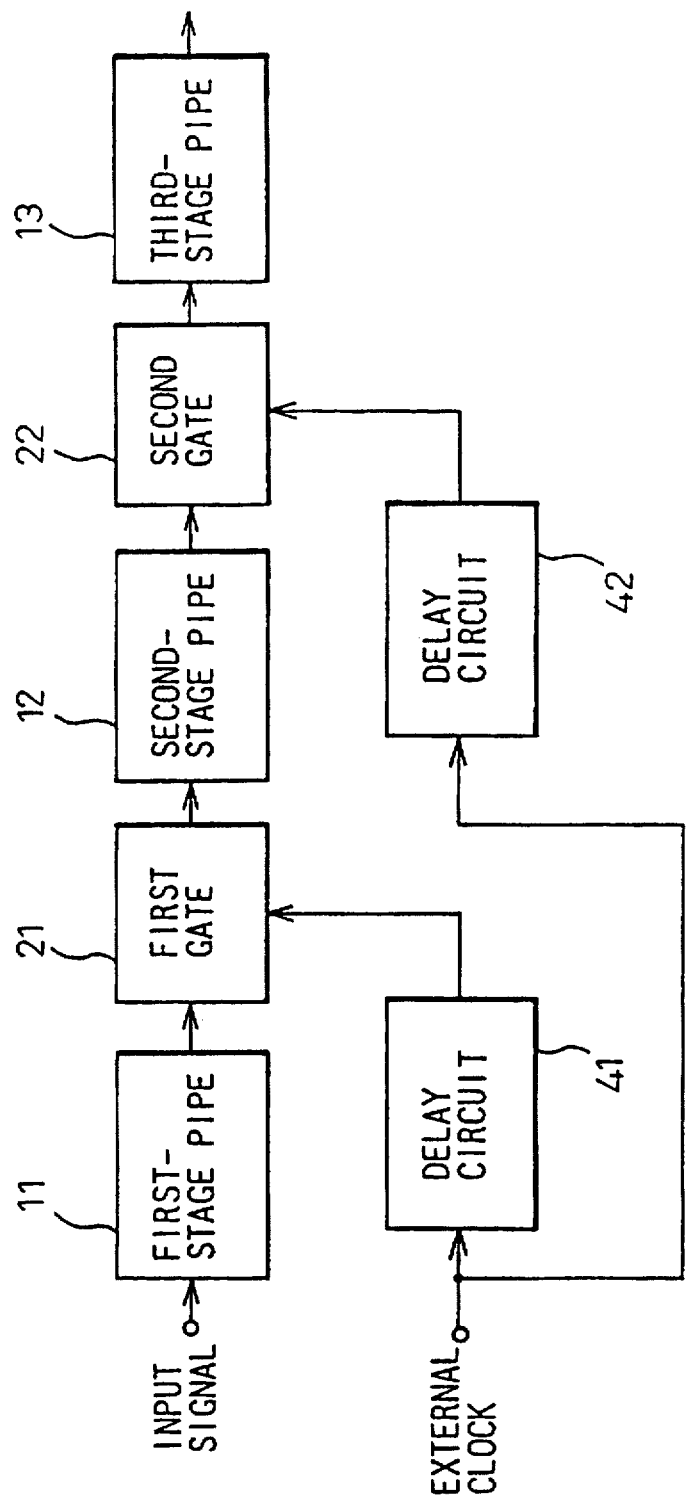
FIG. 1 shows a known pipe structure for an SDRAM.

FIG. 1 shows a pipe structure in an SDRAM. In FIG. 1, reference numeral 11 denotes a first-stage pipe, 12 denotes a second pipe, 21 denotes a first gate interposed between the first-stage pipe 11 and second-stage pipe 12, 22 denotes a second gate interposed between the second-stage pipe 12 and a third-stage pipe, and 41 and 42 denote delay circuits for delaying an external clock applied externally. In the drawings used for the description, for brevity's sake, components having the same functions will bear the same reference numerals. Thus, repetitive parts of the description will be omitted.

There are various ways for grouping pipes in each stage. The number of pipes to be concurrently operated in each stage may be one. Alternatively, pipes may be connected in parallel with one another. Herein, for brevity's sake, no pipe is connected in parallel with another. The present invention is not limited to this mode but can apply to a mode in which pipes connected in parallel mutually are connected in series with other pipes.

As shown in FIG. 1, the gate 21 or 22 for controlling the passage of a signal between adjoining pipes so that an output from a pipe of a previous stage will be transferred according to appropriate timing is interposed between pipes in adjoining stages. The gates 21 and 22 are controlled by signals produced by delaying an external clock using the delay circuits 41 and 42 respectively. In a multi-bit SDRAM, an output from a pipe of a previous stage consists of a plurality of bits. In this case, a plurality of gates are needed. In the description below, an output from a pipe shall be one bit long.

Figure 2:
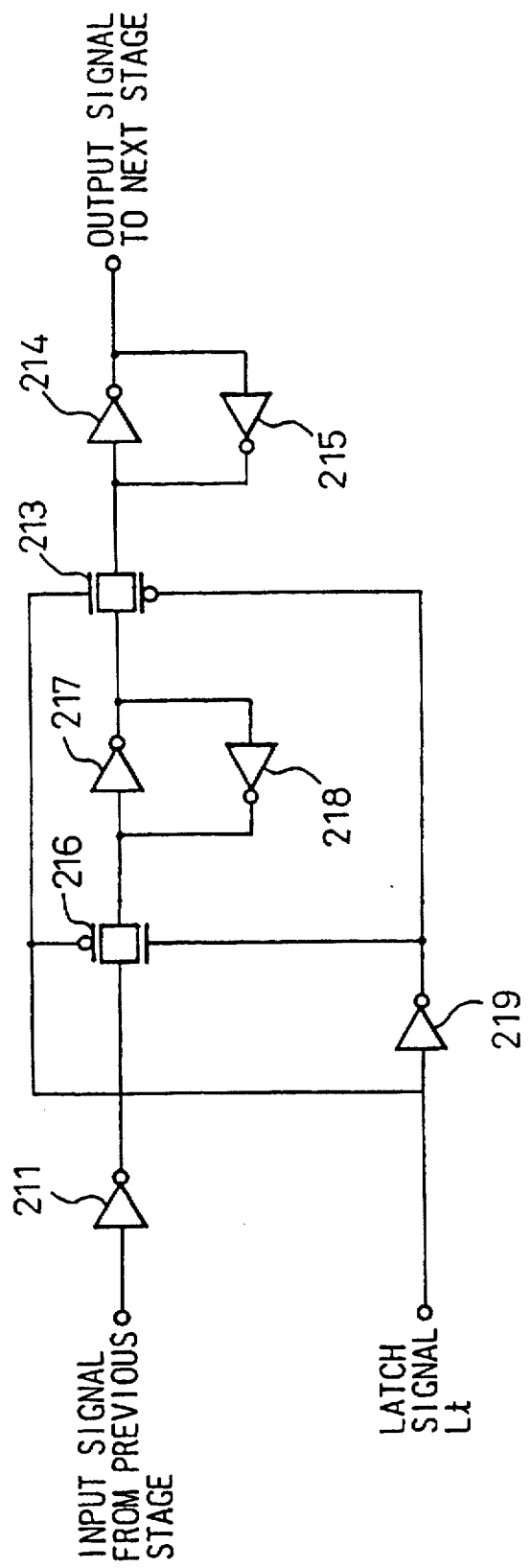
FIG. 2 shows an example of circuitry of a known SDRAM gate.

FIG. 2 shows the circuitry of a gate employed in a known SDRAM. In FIG. 2, a gate has the well-known circuitry comprising two transfer gates 213 and 216, and two flip-flops composed of two inverters 214 and 215 and two inverters 217 and 218 respectively. When a latch signal Lt is low, the transfer gate 216 enters a transfer state and the transfer gate 213 enters a non-transfer state. An input signal from a previous stage is passed by the transfer gate 216 and retained by the flip-flop composed of the inverters 217 and 218. At this time, the transfer gate 213 is in the non-transfer state, and the flip-flop composed of the inverters 214 and 215 retains the current state. When the latch signal Lt is driven high, the transfer gate 216 enters the non-transfer state. The flip-flop composed of the inverters 217 and 218 retains the current state because it is shut off from an output from the previous stage. The transfer gate 213 enters the transfer state at the same time. The signal retained by the flip-flop composed of the inverters 217 and 218 is therefore transmitted to the flip-flop composed of the inverters 214 and 215 and retained thereby.

FIG. 3 shows operations to be performed when a pipe structure includes three pipes as shown in FIG. 1 and a gate included in the pipe structure has the circuitry shown in FIG. 2.

As shown in FIG. 3, a signal having the illustrated waveform is fed as an external clock. At the leading edge of the external clock, an input signal b to be fed synchronously with the external clock is sampled in the first-stage pipe. Processing in the first-stage pipe 11 requires a time interval that is longer than one cycle of the external clock. As illustrated, after processing of the input signal b is completed, an output is supplied from the first-stage pipe 1 at a time instant succeeding a leading edge of the external clock next to the leading edge thereof at which the input signal b is sampled. In other words, the next input signal c is sampled in the first-stage pipe before an output relative to the input signal b is supplied from the first-stage pipe. However, since processing is executed continually in the first-stage pipe 11, when the input signal c is sampled, the processing of the input signal b is under way. The processing of the input signal b will therefore not be affected adversely. After processing is completed in the first-stage pipe 11 as mentioned above, a result of processing is supplied from the first-stage pipe 11.

When a result of processing is supplied from the first-stage pipe 11, a first latch signal is driven low. This causes the transfer gate 216 in the first gate 21 to enter the transfer state and the transfer gate 213 therein to enter the non-transfer state. The result of processing supplied from the first-stage pipe 11 is retained by the flip-flop composed of the inverters 217 and 218 but not transferred to the next stage. Immediately after the result of processing is retained by the flip-flop composed of the inverters 217 and 218, the first latch signal is driven high. The transfer gate 216 is then placed in the non-transfer state so that the retained result of processing will remain intact. The transfer gate 213 is placed in the transfer state, whereby the retained signal is transferred to the next stage so that it will be retained by the flip-flop composed of the inverters 214 and 215. The signal retained by the flip-flop composed of the inverters 214 and 215 is processed in the second-stage pipe 12. Likewise, when a result of processing is supplied from the second-stage pipe 12, a second latch signal is driven low so that the result of processing sent from the second-stage pipe 12 will be retained intact. Immediately thereafter, the second latch signal is driven high. The result of processing is then transferred to the third-stage pipe 13.

A signal to be fed to the first-stage pipe 11 synchronously with an external clock is sampled continually. After the foregoing processing is completed, an output is supplied successively from the third-stage pipe 13 at intervals of the cycle of the external clock. The first output is supplied after an elapse of time calculated by adding up times required for passage through the first and second gates and processing times required in the first- to third-stage pipes. Thereafter, a result of processing is supplied successively from the third-stage pipe 13 at intervals of the cycle of the external clock. Thus, the processing speed increases practically. Assuming that a processing time required in the first-stage pipe 11 is 25 ns, a processing time required in the second-stage pipe 12 is 20 ns, and a processing time required in the third-stage pipe 13 is 15 ns, when piping is not adopted, the time required for processing in the first- to third-stage pipes is 60 ns. When piping is adopted, if the time required for passage through the first or second gate is 6 ns, the time required for processing in the first- to third-stage pipes is 24 ns.

As mentioned above, piping contributes to an increase in operating speed of an SDRAM. Nevertheless, it is necessary to further increase the operating speed of an SDRAM. Piping requires installation of gates. Otherwise, the gates are not needed as they are conventionally not installed. The circuitry of an SDRAM is therefore increased by the sizes of the gates. Consequently, a larger area in a chip becomes necessary for laying out the circuit elements of an SDRAM. From this viewpoint, an area required for laying out gates is required to be as small as possible.

Figure 4:
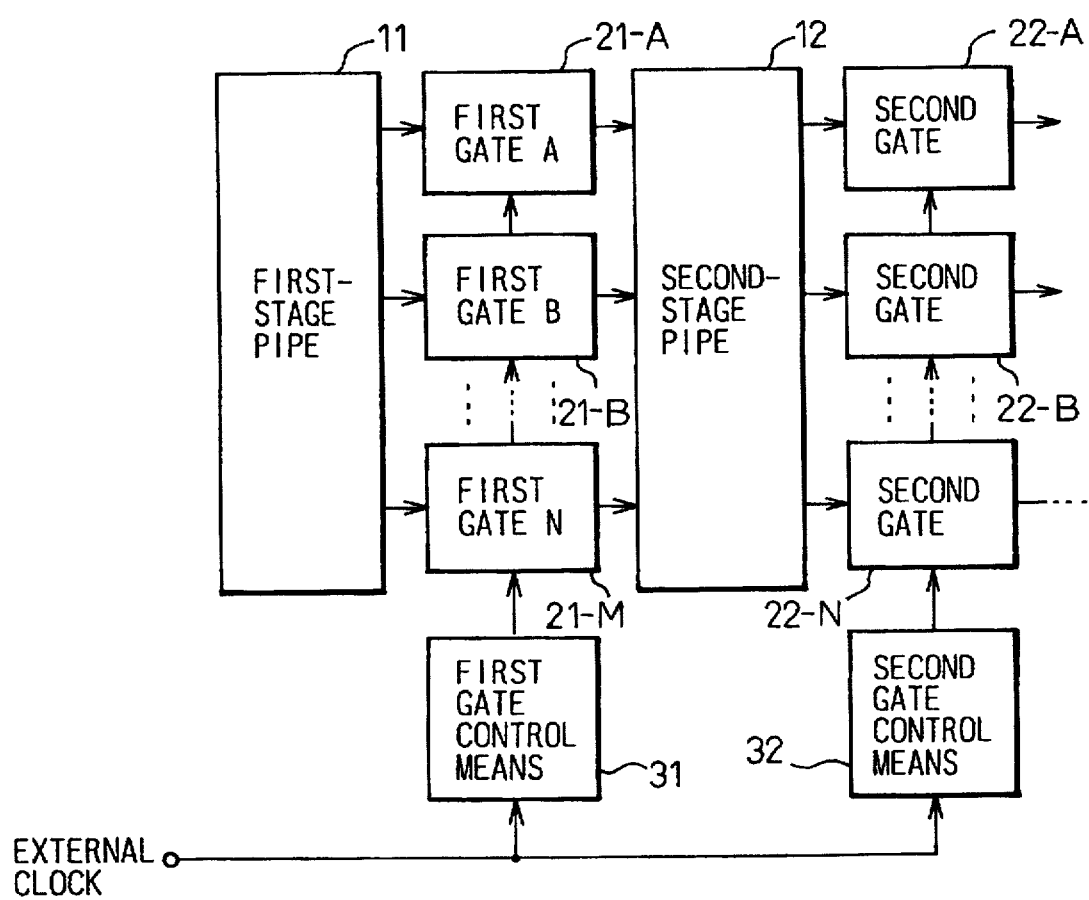
FIG. 4 shows a fundamental constitution of the present invention.
Figure 5A:
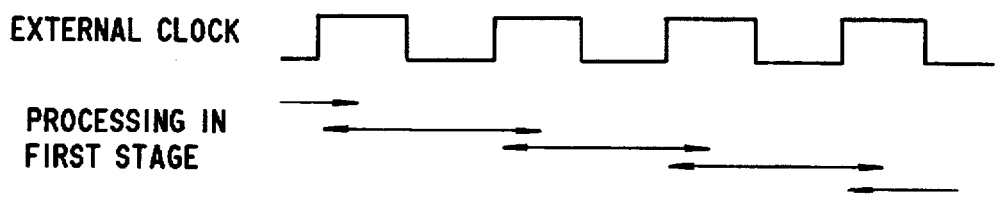
FIG. 5 shows a fundamental operations of the present invention.
Figure 5B:
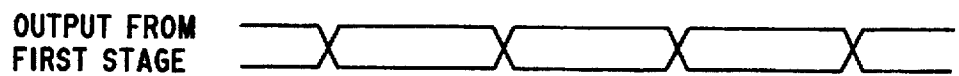
Figure 5C:
Figure 5D:
Figure 5E:

FIGS. 4 and 5 show the principle and configuration of an SDRAM of the present invention.

In an SDRAM of the present invention, as shown in FIG. 4, at least part of signal processing to be executed continually is divided into a plurality of steps, the plurality of steps are executed concurrently in synchronization with an external clock applied externally, and thus the operating speed is increased. The SDRAM comprises a plurality of pipes 11, 12, etc. concurrently execute the plurality of steps into which at least part of a sequence operation for performing signal processing continually is divided, gates 21-A, 21-B, etc., 21-M, 22-A, 22-B, etc., 22-N, etc. each of which is interposed between each pair of the plurality of pipes 11, 12, etc. in order to control passage of a signal between adjoining pipes, and gate control circuits 31, 32, etc. each producing a control signal using an external clock and applying the control signal to a gate to control the gate in such a way that the gate will enter a transfer state immediately before an output from a pipe of a previous stage is finalized or enter a non-transfer state immediately after the output from the pipe of the previous stage is transferred to a pipe of the next stage.

As mentioned above, when an output from a pipe consists of a plurality of bits, a plurality of gates are needed.

As shown in FIG. 5, in the SDRAM of the present invention, each gate is placed in the transfer state immediately before a result of processing is supplied from a pipe of a previous stage, and placed in the non-transfer state immediately after the result of processing supplied from the pipe of the previous stage is transferred to the next stage. A result of processing supplied from a pipe of a previous stage will therefore not be stopped by a gate but will be transferred to a pipe in the next stage. The time required for passage through a gate is therefore substantially nil. Compared with the prior art shown in FIGS. 1 and 2, the present invention can increase the operating speed of an SDRAM by the time required for passage through the gates.

When a gate having the circuitry shown in FIG. 2 is used, a result of processing supplied from a pipe of a previous stage is temporarily stopped by a gate, and then transferred to the next stage responsively to a change in state of a latch signal. In other words, the gate having the circuitry shown in FIG. 2 has the ability to stop and retain an input signal and the ability to transfer the signal to the next stage. Since a signal is stopped and retained temporarily by a gate, the time required for passage through a gate increases. This leads to a decrease in operating speed. By contrast, in the SDRAM of the present invention, a result of processing supplied from a pipe of a previous stage is transferred to a pipe of the next stage without any stoppage at a gate. The time required for passage through a gate is therefore short. The operating speed of an SDRAM is thus upgraded.

In a known SDRAM, an external clock is merely delayed in order to control a gate. When the processing time required in a pipe is much shorter than the cycle of the external clock, for example, when the processing time required in a pipe is shorter than a half of the cycle of the external clock, there is a possibility of causing a malfunction because of the supply of a result of processing of the next signal. To prevent such a malfunction, a gate having the circuitry shown in FIG. 2 is used to temporarily stop and retain a result of processing supplied from a previous stage and to then transfer it to the next stage. However, this leads to an increase in time required for passage through a gate and to a decrease in operating speed.

According to the present invention, an external clock is not merely delayed for use but is used to produce short pulses. Synchronously with a pulse, a gate is placed in a transfer state immediately before a result of processing is supplied from a pipe of a previous stage, so that the result of processing can be transferred to the next stage without any stoppage. Synchronously with another pulse, the gate is placed in a non-transfer state immediately after the transfer is completed. This leads to a decrease in time required for passage through a gate and prevents a malfunction at the same time. However, an external clock cannot be used as it is. A circuit for producing pulses, which are used to control gates, using an external clock must be installed additionally. Nevertheless, the higher operating speed is worth the additional installation.

Figure 6:
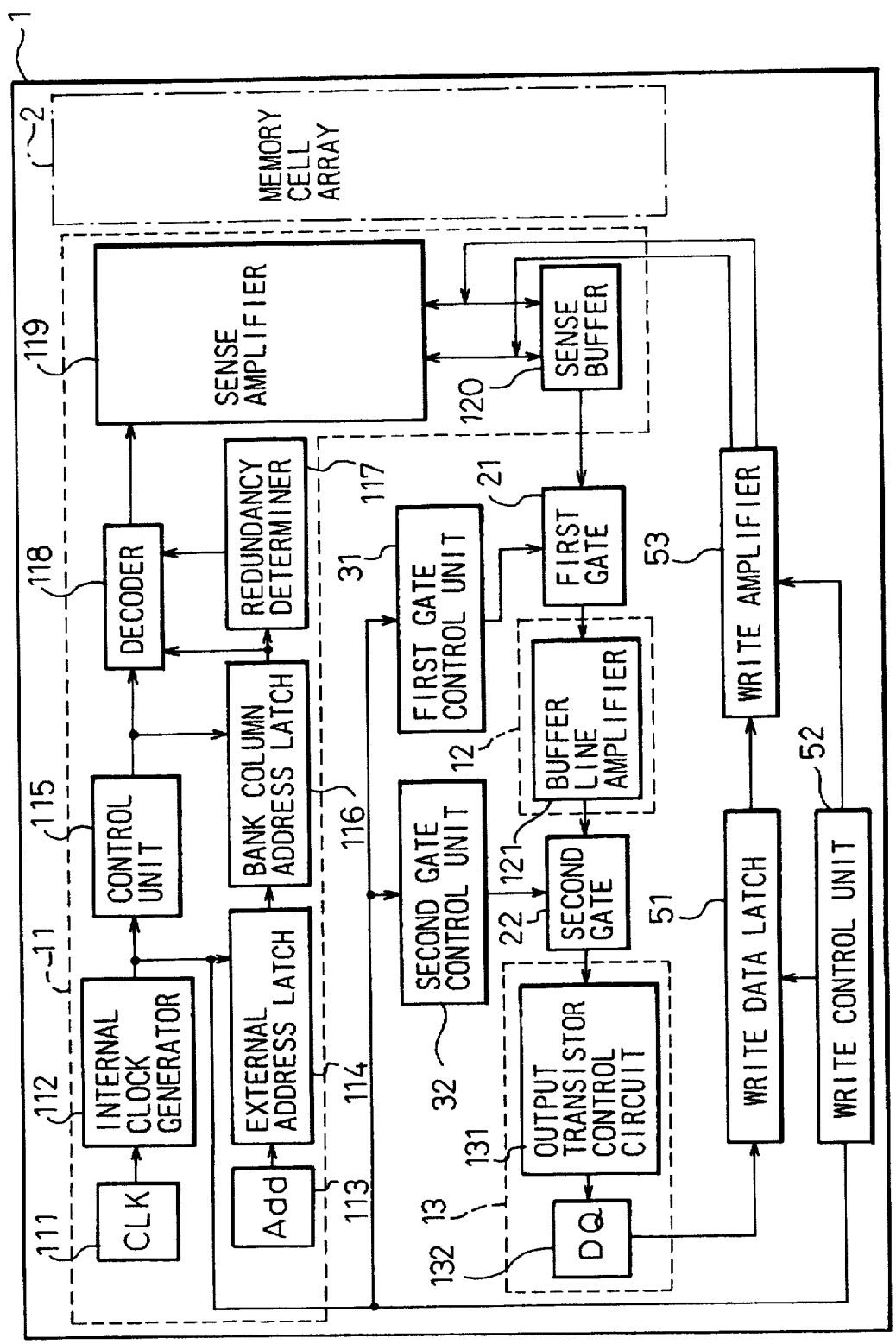
FIG. 6 shows the overall configuration of an SDRAM of an embodiment of the present invention.

FIG. 6 shows the overall configuration of an embodiment of the present invention.

In FIG. 6, reference numeral 1 denotes an SDRAM, 2 denotes a memory cell array, 111 denotes an input buffer for handling an external clock applied externally, 112 denotes an internal clock generator for producing a clock to be used internally from an external clock, 113 denotes a buffer for handling an address signal applied externally, 114 denotes an external address latch for latching an address signal synchronously with a signal provided by the internal clock generator 112, 115 denotes a control unit responsible for overall control, 116 denotes a bank column address latch for latching a column address for each bank in response to a signal sent from the control unit 115, 117 denotes a redundancy determiner for determining whether a column address signal represents a redundant address, 118 denotes a decoder for decoding an address signal, 119 denotes a sense amplifier, 120 denotes a sense buffer, 121 denotes a buffer line amplifier, 131 denotes an output transistor control circuit for controlling an output transistor, 132 denotes a data input/output port, 51 denotes a write data latch for latching data to be written, 52 denotes a write control unit for controlling writing, and 53 denotes a write amplifier. These components are known components constituting a DRAM. The operations of the components have no direct relation to the present invention. The detailed description of the operations will therefore be omitted.

In this embodiment, reading is achieved by piping. The input buffer 111, internal clock generator 112, address signal buffer 113, external address latch 114, control unit 115, bank column address latch 116, redundancy determiner 117, decoder 118, sense amplifier 119, and sense buffer 120 are used to constitute the first-stage pipe 11. The buffer line amplifier 12 is used as the second-stage pipe 12. The output transistor control circuit 131 and data input/output port 132 are used to constitute the third-stage pipe. The first gate 21 is interposed between the first-stage pipe 11 and second-stage pipe 13. The second gate 22 is interposed between the second-stage pipe 12 and third-stage pipe 13. The first gate control unit 31 controls the first gate 21, and the second gate control unit 32 controls the second gate 22. Note that this is a mere example of a pipe structure and that various other variants are conceivable. When each of the outputs of the first-stage pipe 11 and second-stage pipe 12 consists of a plurality of bits, the number of first gates 21 and second gates 22 equal the number of bits. Herein, the number of bits is supposed to be one.

Figure 7:
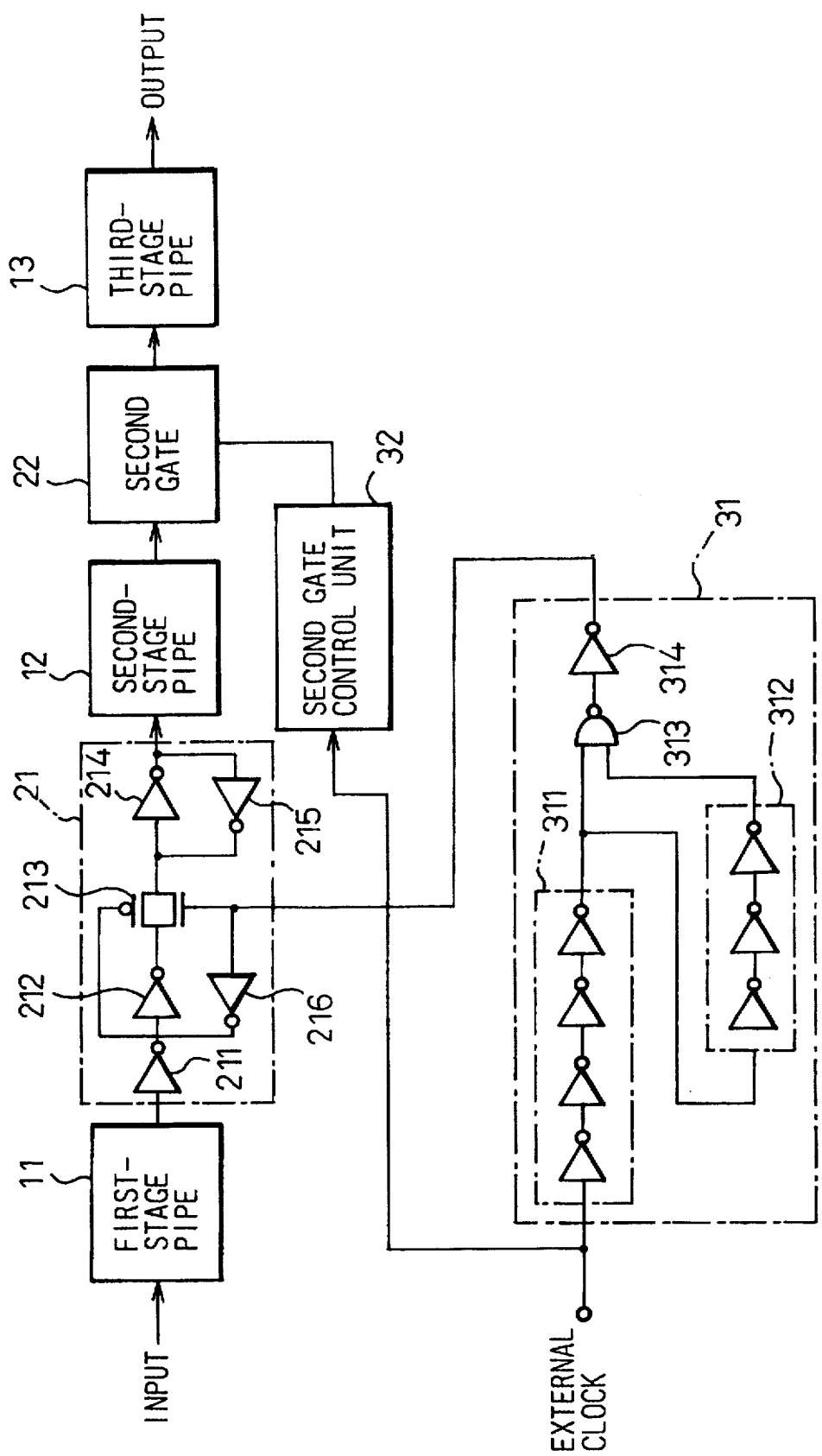
FIG. 7 shows a pipe structure in the embodiment.

FIG. 7 shows the portion of the overall configuration of FIG. 6 relating to a pipe structure. The first gate 21 comprises, as illustrated, a transfer gate 213 and a flip-flop composed of inverters 214 and 215. Reference numerals 211, 212, and 216 denote inverters. The second gate 22 has the same circuit elements as the first gate 21.

The first gate control unit 31 consists of a first delay circuit 311 composed of inverters connected in series with one another in order to delay an external clock by a given time, a second delay circuit 312 for delaying an output of the first delay circuit 311 by a given time, an NAND gate 313 for calculating the NAND of the outputs of the first delay circuit 31 and second delay circuit 312, and an inverter 314 for inverting an output of the NAND gate 313. An output of the inverter 314 is applied to one gate of the transfer gate 213 and also to the other gate thereof via the inverter 216. The output of the inverter 314 is also applied to the second gate 22 via the delay circuit 32. A pulse generated by the first gate control unit 31 must go high immediately before a result of processing is supplied from the first-stage pipe 11, and go low immediately after the result of processing is transferred to the second-stage pipe 12. The timing of causing a pulse to go high is determined according to a delay provided by the first delay circuit 311. A period between when a pulse goes high and then goes low, that is, the pulse duration, is determined according to a delay provided by the second delay circuit 312.

As is apparent from comparison between the first gate 21 in FIG. 7 and the known gate shown in FIG. 2, the first gate 21 is devoid of the transfer gate 216 and the flip-flop composed of the inverters 217 and 218 which are included in the known gate. The known gate temporarily stops and retains an input signal and then passes it. In contrast, in the first gate 21 of this embodiment, the transfer gate 213 remains in the transfer state only for a period during which a pulse is applied to the transfer gate 213. After passing through the transfer gate 213, a signal is retained by the flip-flop composed of the inverters 214 and 215.

FIG. 8 shows the operations performed in the pipe structure in FIG. 8. Referring to FIG. 8, the operations preformed in the pipe structure in this embodiment will be described below.

As shown in FIG. 8, an input signal b fed synchronously with an external clock is sampled in the first-stage pipe 11 at the leading edge of an external clock. Processing in the first-stage pipe 11 requires a time interval that is longer than one cycle of the external clock. After processing of the input signal b is completed, an output relative to the input signal b is supplied from the first-stage pipe 11, as illustrated, at a time instant succeeding a leading edge of the external clock next to the leading edge thereof at which the input signal b is sampled. Before an output relative to the input signal b is supplied from the first-stage pipe 11, the next input signal c is sampled in the first-stage pipe. However, since processing of an address signal or any other processing is executed continually in the first-stage pipe 11, when the input signal c is sampled, processing of the input signal b is under way. Processing of the input signal c will therefore not be affected adversely. In other words, the pipe structure or the cycle of the external clock are determined for fear the processing of the input signal c will be affected adversely. Thus, when processing is completed in the first-stage pipe 11, a result of the processing is supplied from the first-stage pipe 11.

Immediately before a result of processing is supplied from the first-stage pipe 11, a first gate signal to be applied to the first gate is driven high. This causes the transfer gate 213 in the first gate 21 to enter the transfer state. The result of processing supplied from the first-stage pipe 11 is therefore passed by the transfer gate 213, retained by the flip-flop composed of the inverters 214 and 215, and then transferred to the next second-stage pipe 12. An output signal from the first-stage pipe 11 is transferred to the second-stage pipe 12 without any stoppage at the first gate 21. Thus, the time required for passage through the first gate is very short or substantially nil.

A signal retained by the flip-flop composed of the inverters 214 and 215 is processed in the second-stage pipe 12. When a result of processing is supplied from the second-stage pipe 12, a second gate signal to be applied to the second gate 22 is driven high. The result of processing is then transferred to the third-stage pipe 13. The processing time required in the second-stage pipe 12 is shorter than one cycle of the external clock. Responsively to the supply of a result of processing, the second gate 22 enters the passage stage. After the result of processing is transferred, the gate is closed. A malfunction will therefore never occur. In the third-stage pipe 13, similarly to in the second-stage pipe 12, a transferred signal is processed. The processing time required in the third-stage pipe 13 is also shorter than one cycle of the external clock. The same result of processing is supplied successively until a new result of processing is supplied after processing of the next signal is completed. An output is therefore retained intact for a period of time corresponding to one cycle of the external clock.

As mentioned above, in this embodiment, an output signal from a pipe of a previous stage is transferred to a pipe of the next stage without any stoppage in the pipe. The time required for passage through each gate is therefore very short. Assuming that the time required for passage through each gate is substantially nil, when the processing time required in the first-stage pipe 11 is 25 ns, the processing time required in the second-stage pipe 12 is 20 ns, and the processing time required in the third-stage pipe 13 is 15 ns, an output is supplied at intervals of 20 ns. As already described, in the prior art described in conjunction with FIGS. 5 and 6, an output is supplied at intervals of a time required for passage through the gates. Thus, the operating time in this embodiment is shorter than that in the prior art by the time required for passage through gates.

As apparent from comparison between FIGS. 7 and 2, the circuitry of the gate 21 in this embodiment is simpler than that of the known gate. Besides, the number of circuit elements required is smaller. The first gate control circuit 31 shown in FIG. 3 must be installed on behalf of delay circuits. As described previously, when an output of a pipe consists of a plurality of bits, the number of gates must be made equal to the number of bits. Nevertheless, the total number of the circuit elements required is smaller. When the number of stages of pipes is made larger, the total number of the circuit elements required gets further smaller. Consequently, the area needed for laying out all the circuit elements becomes smaller.

As described so far, according to the present invention, the operating speed of an SDRAM can be increased using simple circuitry. Furthermore, the area needed for laying out the SDRAM may become smaller.

What is claimed is:

1. A synchronous DRAM in synchronization with an external clock comprising:

a plurality of pipeline stages concurrently execute signal processing;

a plurality of gates each of which is interposed between adjoining plurality of pipeline stages and controls passage of a signal between said adjoining pipeline stages; and a gate control means for producing a control signal and for applying said control signal to one of the gates to control the gate in such a way that the gate will a) enter a transfer state immediately before outputting said signal from a previous pipeline and b) enter a non-transfer state immediately after said signal from the previous pipeline stage is transferred to a next pipeline stage.

2. A synchronous DRAM according to claim 1, wherein each of said gates includes one transfer gate to which said control signal is applied.

3. A synchronous DRAM according to claim 2, wherein each of said gates includes one flip-flop for latching and retaining a signal that has passed through said transfer gate.

4. A synchronous DRAM according to claim 1, wherein each of said gate control circuits includes a first delay circuit for delaying said external clock by a first given time, a second delay circuit for delaying an output of said first delay circuit by a second given time, and an NAND gate for calculating the NAND of the outputs of said first delay circuit and said second delay circuit.

5. A synchronous DRAM according to claim 1, wherein a period of the transfer state of each gate is shorter than a period of a high level of said external clock.

6. A synchronous DRAM in synchronization with an external clock having a period, comprising:
- a first pipeline stage receiving an input signal, executing signal processing for a first time period, and outputting a first output signal at an output node;
- a transfer gate operatively connected to said output node, entering a transfer state in response to a control signal to output a transfer signal;
- a second pipeline stage receiving said transfer signal, executing signal processing concurrently with said first pipeline stage; and
- a transfer gate control circuit producing said control signal such that said control signal makes said transfer state, which is shorter than said first time period, in synchronization with output timing of said first output signal.

7. A synchronous DRAM according to claim 6, wherein said control signal having a period substantially the same as that of said external clock.

8. A synchronous DRAM according to claim 7, wherein said first time period being longer than the period of said external clock.

9. A synchronous DRAM according to claim 1, wherein said control signal controls said gate in synchronization with an output timing of the previous pipeline stage.

* * * * *